US009380447B2

(12) United States Patent
Ruutu et al.

(10) Patent No.: US 9,380,447 B2
(45) Date of Patent: Jun. 28, 2016

(54) APPARATUS, METHODS, COMPUTER READABLE STORAGE MEDIUMS AND COMPUTER PROGRAMS

(75) Inventors: Jussi Ruutu, Espoo (FI); Ismo Laitinen, Espoo (FI); Janne Öfversten, Tampere (FI)

(73) Assignee: Nokia Technologies Oy, Espoo (FI)

( * ) Notice: Subject to any disclaimer, the term of this patent is extended or adjusted under 35 U.S.C. 154(b) by 843 days.

(21) Appl. No.: 13/637,492

(22) PCT Filed: Feb. 1, 2011

(86) PCT No.: PCT/FI2011/050082
§ 371 (c)(1),
(2), (4) Date: Feb. 17, 2014

(87) PCT Pub. No.: WO2011/121170
PCT Pub. Date: Oct. 6, 2011

(65) Prior Publication Data
US 2014/0349717 A1    Nov. 27, 2014

(30) Foreign Application Priority Data

Mar. 30, 2010    (GB) .................................. 1005328.8

(51) Int. Cl.
*H04W 8/18*        (2009.01)
*H04W 88/02*       (2009.01)
*H04W 52/02*       (2009.01)
(Continued)

(52) U.S. Cl.
CPC ................ *H04W 8/18* (2013.01); *H04B 17/23* (2015.01); *H04W 52/0251* (2013.01); *H04W 52/0261* (2013.01); *H04W 88/02* (2013.01); *G01R 31/3689* (2013.01); *Y02B 60/50* (2013.01)

(58) Field of Classification Search
CPC ......... G01R 31/3689; H04W 52/0251; H04W 52/0261; H04W 88/02; H04B 17/23
See application file for complete search history.

(56) References Cited

U.S. PATENT DOCUMENTS

| 5,958,058 | A | 9/1999 | Barrus |
| 2001/0020940 | A1 | 9/2001 | Nakazato et al. |
| 2002/0142792 | A1 | 10/2002 | Martinez |

(Continued)

FOREIGN PATENT DOCUMENTS

| CN | 101088272 A | 12/2007 |
| DE | 10345437 A1 | 5/2005 |

(Continued)

OTHER PUBLICATIONS

Extended European Search Report received in corresponding European (EP) application No. 11762065.8. Dated Aug. 27, 2013. 7 pages.
(Continued)

*Primary Examiner* — Lewis West
(74) *Attorney, Agent, or Firm* — Alston & Bird LLP

(57) ABSTRACT

An apparatus (10) comprising: at least one memory (16) storing computer program instructions; at least one processor (14) configured to execute the computer program instructions to cause the apparatus (10) at least to perform: determining values of one or more parameters of an electrical energy storage device (28) for a plurality of profiles of the apparatus (10), the plurality of profiles being defined by one or more user programmable apparatus settings; and performing a function using the determined values of the one or more parameters of the electrical energy storage device (28).

15 Claims, 3 Drawing Sheets

(51) Int. Cl.
*G01R 31/36* (2006.01)
*H04B 17/23* (2015.01)

(56) References Cited

U.S. PATENT DOCUMENTS

| | | | |
|---|---|---|---|
| 2003/0158609 A1* | 8/2003 | Chiu | 700/22 |
| 2004/0122949 A1* | 6/2004 | Zmudzinski et al. | 709/225 |
| 2005/0071561 A1 | 3/2005 | Olsen et al. | |
| 2006/0143298 A1 | 6/2006 | Anttila et al. | |
| 2007/0111764 A1 | 5/2007 | Park | |
| 2007/0164708 A1 | 7/2007 | Jiang | |
| 2007/0219732 A1 | 9/2007 | Creus et al. | |
| 2007/0252552 A1 | 11/2007 | Walrath | |
| 2008/0037979 A1 | 2/2008 | Guthrie et al. | |
| 2008/0129521 A1 | 6/2008 | Yoon | |
| 2008/0141049 A1 | 6/2008 | Hassan et al. | |
| 2008/0200220 A1 | 8/2008 | Jackson | |
| 2009/0117949 A1 | 5/2009 | Allen, Jr. et al. | |
| 2009/0292487 A1 | 11/2009 | Duncan et al. | |

FOREIGN PATENT DOCUMENTS

| | | |
|---|---|---|
| EP | 1521438 A1 | 4/2005 |
| EP | 2009886 A1 | 12/2008 |
| EP | 2023682 A1 | 2/2009 |
| GB | 2373886 A | 10/2002 |
| GB | 2397972 A | 8/2004 |
| JP | 2011-259183 A | 9/1999 |
| WO | 2004/029642 A1 | 4/2004 |
| WO | 2006/030368 A2 | 3/2006 |
| WO | 2006/052413 A1 | 5/2006 |
| WO | 2008101251 A1 | 8/2008 |
| WO | 2009/081293 A1 | 7/2009 |

OTHER PUBLICATIONS

Office action received for corresponding Chinese Patent Application No. 201180026670.5, dated Jan. 21, 2015, 9 pages of office action and No English Language Translation available.
Krintz et al., "Application-Level Prediction of Battery Dissipation", Proceedings of the International Symposium on Low Power Electronics and Design, Aug. 9-11, 2004, 6 pages.
Ravi et al., "Context-Aware Battery Management for Mobile Phones: A Feasibility Study", Proceedings of the Sixth Annual IEEE International Conference on Pervasive Computing and Communications, 2008, 16 pages.
Search Report received for corresponding United Kingdom Patent Application No. 1005328.8, dated Aug. 2, 2010, 4 pages.
International Search Report and Written Opinion received for corresponding Patent Cooperation Treaty Application No. PCT/FI2011/050082, dated May 6, 2011, 15 pages.
Final Office action received for corresponding Russian Patent Application No. 2012144774, dated Feb. 25, 2014, 5 pages of office action and 2 pages of office action translation.
Office action received for corresponding Chinese Patent Application No. 201180026670.5, dated Mar. 28, 2014, 11 page, No English Language Translation available.
"Nokia Energy Profiler", Nokia, Retrieved on Apr. 3, 2014, Webpage available at : https://wiki.aalto.fi/download/attachments/40029244/nepesitys.pdf.
Office Action for European Application No. EP 11 762 065.8 dated Nov. 6, 2015.

* cited by examiner

APPARATUS, METHODS, COMPUTER READABLE STORAGE MEDIUMS AND COMPUTER PROGRAMS

RELATED APPLICATION

This application was originally filed as PCT Application No. PCT/FI2011/050082 filed Feb. 1, 2011, which claims priority to Great Britain Application No. 1005328.8 filed Mar. 30, 2010.

FIELD OF THE INVENTION

Embodiments of the present invention relate to apparatus, methods, computer readable storage mediums and computer programs. In particular, they relate to apparatus, methods, computer readable storage mediums and computer programs in a mobile cellular telephone.

BACKGROUND TO THE INVENTION

Apparatus, such as mobile cellular telephones, usually include an electrical energy storage device (a battery for example) for providing electrical energy to the electronic components of the apparatus. If the electrical energy stored in the electrical energy storage device falls below a threshold, the apparatus may become inoperable. This may be inconvenient for a user if they require the apparatus to be operable (to make a telephone call for example).

It would therefore be desirable to provide an alternative apparatus.

BRIEF DESCRIPTION OF VARIOUS EMBODIMENTS OF THE INVENTION

According to various, but not necessarily all, embodiments of the invention there is provided an apparatus comprising: at least one memory storing computer program instructions; at least one processor configured to execute the computer program instructions to cause the apparatus at least to perform: determining values of one or more parameters of an electrical energy storage device for a plurality of profiles of the apparatus, the plurality of profiles being defined by one or more user programmable apparatus settings; and performing a function using the determined values of the one or more parameters of the electrical energy storage device.

The apparatus may be for monitoring an electrical energy storage device.

The function may include controlling a display to display the determined values of the one or more parameters of the electrical energy storage device to a user of the apparatus.

The function may include controlling a display to display a recommended profile, selected from the plurality of profiles, to a user of the apparatus.

The function may include controlling the apparatus to automatically enter a profile without user intervention.

The at least one processor may be configured to execute the computer program instructions to cause the apparatus to further perform: determining values for a parameter of an electrical energy storage device for one or more user programmable apparatus settings, and controlling a display to display the determined parameter values for the one or more user programmable apparatus settings.

The at least one processor may be configured to execute the computer program instructions to cause the apparatus to further perform: determining values of a parameter of an electrical energy storage device for one or more applications, and controlling a display to display the determined parameter values of the one or more applications.

The at least one processor may be configured to execute the computer program instructions to cause the apparatus to further perform: enabling a user to program the user programmable apparatus settings to adapt an existing profile and/or to create a profile.

The at least one processor may be configured to execute the computer program instructions to cause the apparatus to further perform: controlling a transmitter to transmit an adapted profile and/or a created profile to a server, the server being configured to transmit the adapted profile and/or the created profile to other apparatus.

The parameter may be indicative of the usage of the electrical energy storage device by the apparatus.

The parameter may include power consumption of the electrical energy storage device by the apparatus.

The parameter may include remaining operating time of the apparatus being powered by the electrical energy storage device.

The user programmable apparatus settings may be configured to control how one or more components of the apparatus function. The user programmable apparatus settings may be independent of any applications being executed by the at least one processor.

According to various, but not necessarily all, embodiments of the invention there is provided a method comprising: determining values of one or more parameters of an electrical energy storage device for a plurality of profiles of an apparatus, the plurality of profiles being defined by one or more user programmable apparatus settings; and performing a function using the determined values of the one or more parameters of the electrical energy storage device.

The function may include controlling a display to display the determined values of the one or more parameters of the electrical energy storage device to a user of the apparatus.

The function may include controlling a display to display a recommended profile, selected from the plurality of profiles, to a user of the apparatus.

The function may include controlling the apparatus to automatically enter a profile without user intervention.

The method may further comprise: determining values for a parameter of an electrical energy storage device for one or more user programmable apparatus settings, and controlling a display to display the determined parameter values for the one or more user programmable apparatus settings.

The method may further comprise: determining a value of a parameter of an electrical energy storage device for one or more applications, and controlling a display to display the determined parameter values of the one or more applications.

The method may further comprise: enabling a user to program the user programmable apparatus settings to adapt an existing profile and/or to create a profile.

The at least one processor may be configured to execute the computer program instructions to cause the apparatus to further perform: controlling a transmitter to transmit an adapted profile and/or a created profile to a server, the server being configured to transmit the adapted profile and/or the created profile to other apparatus.

The parameter may be indicative of the usage of the electrical energy storage device by the apparatus.

The parameter may include power consumption of the electrical energy storage device by the apparatus.

The parameter may include remaining operating time of the apparatus being powered by the electrical energy storage device.

The user programmable apparatus settings may be configured to control how one or more components of the apparatus function. The user programmable apparatus settings may be independent of any applications being executed by the at least one processor.

According to various, but not necessarily all, embodiments of the invention there is provided a computer readable storage medium encoded with instructions that, when executed by a processor, performs: determining values of one or more parameters of an electrical energy storage device for a plurality of profiles of an apparatus, the plurality of profiles being defined by one or more user programmable apparatus settings; and performing a function using the determined values of the one or more parameters of the electrical energy storage device.

The function may include controlling a display to display the determined values of the one or more parameters of the electrical energy storage device to a user of the apparatus.

The function may include controlling a display to display a recommended profile, selected from the plurality of profiles, to a user of the apparatus.

The function may include controlling the apparatus to automatically enter a profile without user intervention.

The user programmable apparatus settings may be configured to control how one or more components of the apparatus function. The user programmable apparatus settings may be independent of any applications being executed by the at least one processor.

According to various, but not necessarily all, embodiments of the invention there is provided a computer program that, when run on a computer, performs: determining values of one or more parameters of an electrical energy storage device for a plurality of profiles of an apparatus, the plurality of profiles being defined by one or more user programmable apparatus settings; and performing a function using the determined values of the one or more parameters of the electrical energy storage device.

The function may include controlling a display to display the determined values of the one or more parameters of the electrical energy storage device to a user of the apparatus.

The function may include controlling a display to display a recommended profile, selected from the plurality of profiles, to a user of the apparatus.

The function may include controlling the apparatus to automatically enter a profile without user intervention.

The user programmable apparatus settings may be configured to control how one or more components of the apparatus function. The user programmable apparatus settings may be independent of any applications being executed by the at least one processor.

According to various, but not necessarily all, embodiments of the invention there is provided an apparatus comprising: means for determining values of one or more parameters of an electrical energy storage device for a plurality of profiles of an apparatus, the plurality of profiles being defined by one or more user programmable apparatus settings; and means for performing a function using the determined values of the one or more parameters of the electrical energy storage device.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EMBODIMENTS OF THE INVENTION

In the following description, the wording 'connect' and 'couple' and their derivatives mean operationally connected/coupled. It should be appreciated that any number or combination of intervening components can exist (including no intervening components).

Figure 1:
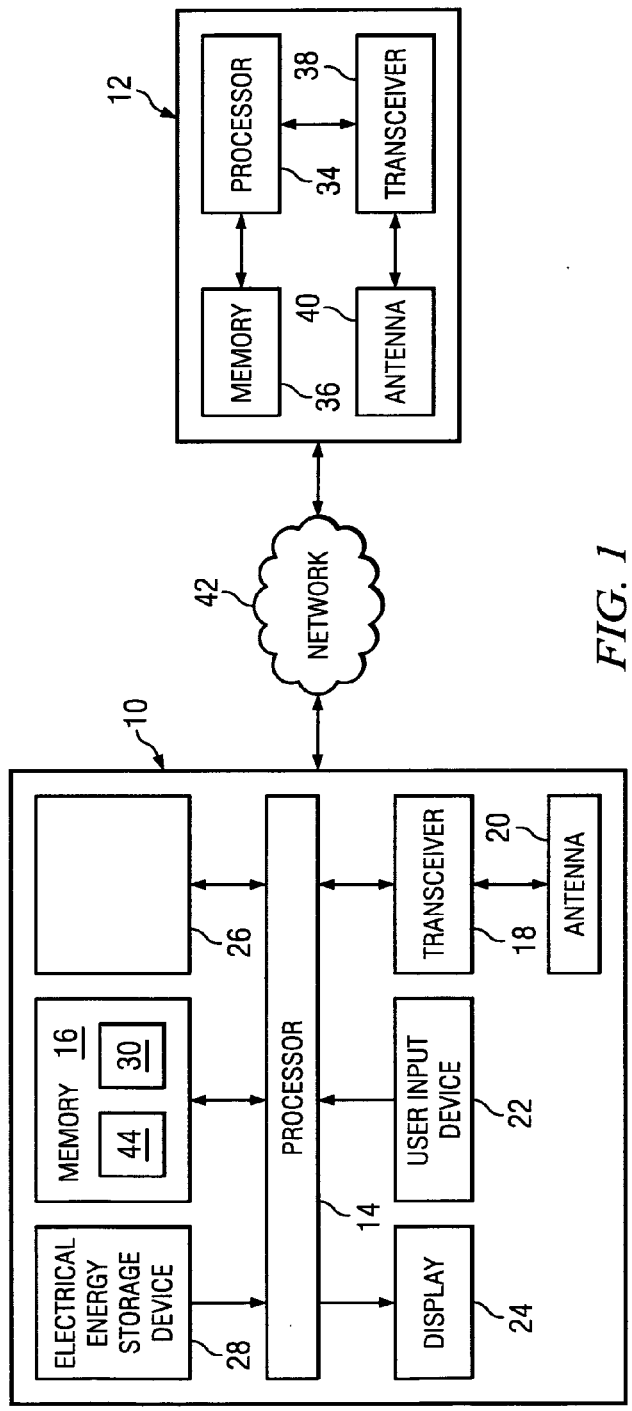
FIG. 1 illustrates a schematic diagram of an apparatus according to various embodiments of the invention.

FIG. 1 illustrates a schematic diagram of an apparatus 10 according to various embodiments of the invention and a server 12. The apparatus 10 includes a processor 14, a memory 16, a transceiver 18, one or more antennas 20, a user input device 22, a display 24, functional circuitry 26 and an electrical energy storage device 28.

The apparatus 10 may be any device and may be a portable device (for example, a mobile cellular telephone, a personal digital assistant (PDA), a palmtop computer or a laptop computer), a non-portable device (for example, a desk top computer) or a module for such devices. As used here, 'module' refers to a unit or apparatus that excludes certain parts/components that would be added by an end manufacturer or a user. It should be appreciated that at least some of the features mentioned in the preceding paragraph may or may not be included in devices according to embodiments of the present invention.

The processor 14 may be any suitable processor and may be a microprocessor for example. Implementation of the processor 14 can be in hardware alone (for example, a circuit, a processor and so on), have certain aspects in software including firmware alone or can be a combination of hardware and software (including firmware).

The processor 14 may be implemented using instructions that enable hardware functionality, for example, by using executable computer program instructions in a general-purpose or special-purpose processor that may be stored on a computer readable storage medium (for example, a disk, a memory and so on) to be executed by such a processor.

The processor 14 is configured to read from and write to the memory 16. The processor 14 may also comprise an output interface via which data and/or commands are output by the processor 14 and an input interface via which data and/or commands are input to the processor 14.

The memory 16 may be any suitable memory and may, for example be permanent built-in memory such as flash memory or it may be a removable memory such as a hard disk, secure digital (SD) card or a micro-drive. The memory 16 stores a computer program 30 comprising computer program instructions that control the operation of the apparatus 10 when loaded into the processor 14. The computer program instructions 30 provide the logic and routines that enables the apparatus 10 to perform the methods illustrated in FIGS. 2, 4, 5 and 6. The processor 14 by reading the memory 16 is able to load and execute the computer program 30.

The computer program may arrive at the apparatus 10 via any suitable delivery mechanism 32. The delivery mechanism 32 may be, for example, a computer-readable storage medium, a computer program product, a memory device, a record medium such as a Compact Disc (CD-ROM), a Digital Versatile Disc (DVD), a Blu-Ray disc, or any article of manufacture that tangibly embodies the computer program 30. The delivery mechanism 32 may be a signal configured to reliably transfer the computer program 30. The apparatus 10 may propagate or transmit the computer program 30 as a computer data signal.

Although the memory 16 is illustrated as a single component it may be implemented as one or more separate components some or all of which may be integrated/removable and/or may provide permanent/semi-permanent/dynamic/cached storage.

References to 'computer-readable storage medium', 'computer program product', 'tangibly embodied computer program' and so on, or a 'controller', 'computer', 'processor' and so on, should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other devices. References to computer program, instructions, code and so on should be understood to encompass software for a programmable processor or firmware such as, for example, the programmable content of a hardware device whether instructions for a processor, or configuration settings for a fixed-function device, gate array or programmable logic device and so on.

The transceiver 18 is connected to the antenna 20 and to the processor 14. The processor 14 is configured to provide data to the transceiver 18. The transceiver 18 is configured to encode the data and provide the encoded data to the antenna 20 for transmission. The antenna 20 is configured to transmit the encoded data as a radio signal. The antenna 20 is also configured to receive a radio signal. The transceiver 18 receives the radio signal from the antenna 20 and decodes the radio signal into data. The radio signal may have a frequency within a licensed cellular frequency band (for example, within a Global System for Mobile communications (GSM) frequency band (for example, 900 MHz)).

The user input device 22 (which may for example include one or more keys or a keypad) may be operable by a user to provide control signals to the processor 14. The user input device 22 may enable a user to control some or all aspects of a graphical user interface displayed on the display 24 of the apparatus 10.

The display 24 is configured to receive and display data from the processor 14. The processor 14 may read data from the memory 16 and provide the data to the display 24 for display to a user of the apparatus 10. The display 24 may be any suitable display and may be, for example, a thin film transistor (TFT) display, a liquid crystal display (LCD) or a light emitting diode (LED) display (for example, an organic light emitting diode (OLED) display).

In some embodiments, the user input device 22 may be incorporated into the display to provide a touch screen display (for example, a resistive or a capacitive touch screen display). The display 24 may include one or more sensors (not illustrated) for sensing the application of force by a user and for providing a control signal to the processor 14. The processor 14 may be configured to control the display 24 using control signals received from the one or more sensors.

The functional circuitry 26 includes other (optional) circuitry such as an audio input device (a microphone for example), an audio output device (a loudspeaker for example) and an imaging unit (including a charge coupled device (CCD) camera or a complementary metal oxide semiconductor (CMOS) camera). The functional circuitry 26 may also contain circuitry, such energy and power management circuitry that are used for monitoring and maintaining the electrical energy storage device 28.

The electrical energy storage device 28 may be any device that is capable of storing electrical energy. For example, the electrical energy storage device 12 may be a battery (a device that converts chemical energy to electrical energy) and may be, for example, a nickel cadmium (NiCd) battery, a nickel metal hydride (NiMH) battery, lithium-ion (Li-ion) battery, or a lithium ion polymer battery. Alternatively, the electrical energy storage device 28 may be, for example, a capacitor that is configured to store energy as electrical capacitance. The electrical energy storage device 28 may also contain circuitry to modify the electrical energy, for example to change the electrical voltage from one level to another. Further on, the electrical energy storage device 28 may also contain circuitry that allows the monitoring and maintenance of the electrical energy storage device 28, for example the battery voltage or the battery current. It should be understood that there may also exist several electrical energy storage devices 28. For example, the apparatus 10 may include two or more batteries that may have different electrical energy characteristics (such as the amount of energy stored).

The electrical energy storage device 28 is configured to supply electrical energy to the processor 14, the memory 16, the transceiver 18, the user input device 22, the display 24 and the functional circuitry 26 to enable them to function. For example, the electrical energy storage device 28 may provide electrical energy to the display 24 so that a graphical user interface, images, videos and text may be displayed to a user of the apparatus 10. It should be understood that as the components of the apparatus 10 function, they drain energy from the electrical energy storage device 28 and reduce the electrical energy stored in the electrical energy storage device 28.

The server 12 includes a processor 34, a memory 36, a transceiver 38 and an antenna 40. The processor 34, the memory 36, the transceiver 38 and the antenna 40 may be similar to the processor 14, the memory 16, the transceiver 18 and the antenna 20 respectively and will not be described in any further detail.

The apparatus 10 and the server 12 are configured to communicate with one another via the network 42. In particular, the apparatus 10 and the server 12 may transmit data to one another via the network 42 and receive data from one another via the network 42. The network 42 may be any suitable network and may be a cellular network or the internet for example.

The apparatus 10 has a plurality of configurations (which may also be referred to as 'profiles' or 'modes') which are defined by one or more user programmable apparatus settings. The user programmable apparatus settings control how one or more components of the apparatus 10 function and are substantially independent of any applications being executed by the processor 14. The setting of the user programmable apparatus settings is applied to the applications executed by the processor 14. A user may control the user input device 22 to program the user programmable apparatus settings to a desired setting and thus adapt an existing configuration or create a new configuration.

One example of a user programmable apparatus setting is the brightness of a back light of the display 24. The user of the apparatus 10 may control the user input device 22 to change the brightness of the back light of the display 24 to a desired brightness level. That brightness level is then used for applications executed by the processor 14 (for example, a graphical user interface, an internet browser application, and gaming applications).

Another example of a user programmable apparatus setting is the audio output volume of a loud speaker 26 of the apparatus. The user of the apparatus 10 may control the user input device 22 to change the output volume of the loud speaker 26 to a desired level. That output volume is then used for applications executed by the processor 14.

Yet another example of a user programmable apparatus setting is the speed of processing at the processor 14. For example, the apparatus 10 may be configured to scale the speed of a processor, such as clock frequency and voltage scaling, which trade energy consumption against the speed of execution at the processor.

It should be understood that a configuration of the apparatus 10 provides the apparatus 10 with a particular set of operating characteristics that may be useful for different contexts. For example, the apparatus 10 may have a 'general profile' which is suitable for everyday use, and/or an 'outdoor profile' which is suitable for outdoor use, and/or a 'meeting profile' which is suitable for instances where the user would like the apparatus 10 to function in a discrete manner, and/or a 'maximum performance profile' and/or a 'maximum battery profile' which is set to minimize electrical energy consumption from the electrical energy storage device 28. By way of an example, the 'meeting profile' configuration provides a more discrete mode since the audio output volume is set to a low volume level or is set mute. By way of a further example, the 'outdoor profile' is suitable for outdoors because the volume of audio output from the loudspeaker 26 is set high.

It should be appreciated that the plurality of configurations of the apparatus 10 may use different amounts of electrical energy over a period of time. For example, the 'meeting profile' configuration may use less electrical energy than the 'general profile' configuration because less electrical energy is supplied to the audio output device 26. By way of a further example, the 'maximum battery profile' configuration may use less electrical energy than the other configurations because each of the user programmable apparatus settings are set to a level that consumes a minimal amount of electrical energy.

The memory 16 stores a database 44 that includes values of one or more parameters of the electrical energy storage device 28 for a plurality of configurations of the apparatus 10. The value of a parameter is indicative of the usage of the electrical energy storage device 28 by the components of the apparatus 10. The parameters of the electrical energy storage device 28 may include (but are not limited to) remaining operating time of the apparatus 10 being powered by the electrical energy storage device 28, average power consumption of the electrical energy storage device 28 by the apparatus 10, maximum power consumption, minimum power consumption, median power consumption, the variance in power consumption and maximum capacity of the electrical energy storage device 28.

The processor 14 is configured to measure (periodically or non-periodically) values of one or more of the parameters of the electrical energy storage device 28 for the configurations of the apparatus 10, and to store the measured values in the database 44. When executing these actions, the processor 14 may use the circuitry of the electrical energy storage device 28 itself and/or the circuitry of the functional circuitry 26. For example, when the apparatus 10 is in a configuration, the processor 14 may (periodically or non-periodically) measure the power consumption from the electrical energy device 28 and then determine the average power consumption taking the latest measurement into account for that particular configuration. The updated average power consumption is then stored in the database 44 for that configuration. When the apparatus 10 enters another configuration, the processor 14 may (periodically or non-periodically) measure, then determine and store the average power consumption from the electrical energy device 28 for that configuration.

By way of another example, the processor 14 may determine the remaining operating time for some or all of the configurations by measuring the remaining electrical energy stored in the electrical energy storage device 28 and by then dividing the measured electrical energy by the average power consumptions of the configurations. The processor 14 then controls the storage of the calculated remaining operating times for the configurations in the database 44.

The database 44 may also include values of one or more parameters of the electrical energy storage device 28 for one or more applications of the apparatus 10. For example, the database 44 may include the average power consumed by a web browser application. Additionally, the database 44 may include values of one or more parameters of the electrical energy storage device 28 for one or more user programmable apparatus settings. For example, the database 44 may include the average power consumed by the backlight of the display 24.

The apparatus 10 is configured to perform a function using the values of the one or more parameters of the electrical energy storage device 28 stored in the database 44. This will be described in greater detail in the following paragraphs with reference to FIGS. 2 to 6.

Figure 2:
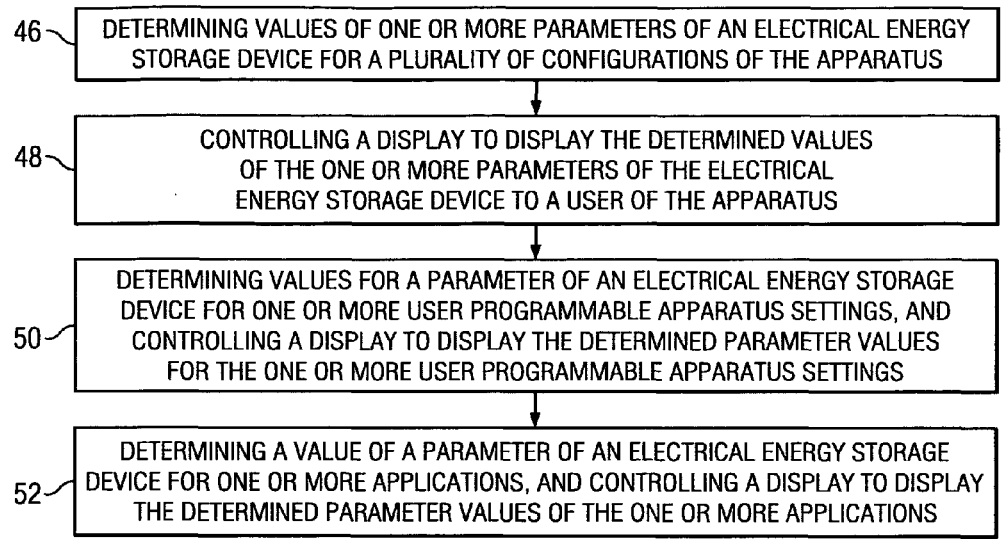
FIG. 2 illustrates a flow diagram of a method according to various embodiments of the invention.

FIG. 2 illustrates a flow diagram of a method according to various embodiments of the invention. At block 46, the processor 14 determines values of one or more parameters of the electrical energy storage device 28 for a plurality of configurations of the apparatus 10. The processor 14 may read from the database 44 stored in the memory 16 to determine values of the one or more parameters. For example, the processor 14 may read average power consumption values from the database 44 for a plurality of configurations. Alternatively, the processor 14 may read average power consumption values from the electrical energy storage device 28 or from the functional circuitry 26, if they include suitable circuitry.

At block 48, the processor 14 controls the display 24 to display the determined values of the one or more parameters of the electrical energy storage device 28 to a user of the apparatus 10. It should be appreciated that the display 24 may display any of the parameters mentioned above for a plurality of configurations. The processor 14 may control the display 24 to display the parameter values in response to a user request (for example, the user may select a user selectable object (an icon for example) of the graphical user interface to cause the display of the parameter values).

Figure 3A:
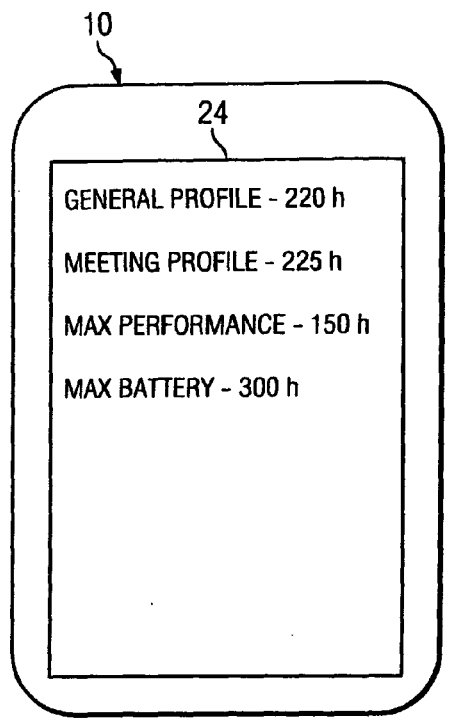
FIGS. 3A to 3D illustrate a front view of an apparatus according to various embodiments of the invention.
Figure 3B:
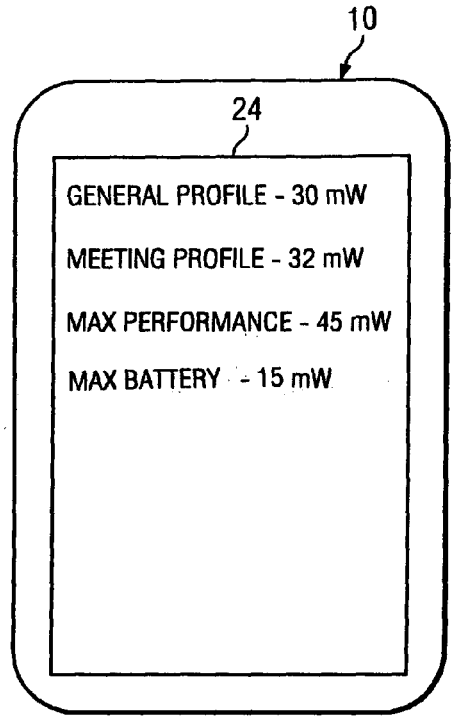

For example, the processor 14 may control the display 24 to display the remaining operating time for a plurality of configurations as illustrated in FIG. 3A. In FIG. 3A, the display 24 includes the text "General Profile—220 H", "Meeting Profile—225 H", "Max Performance—150 H" and "Max battery—300 H". By way of a further example, the processor 14 may control the display 24 to display the average power consumption for a plurality of configurations as illustrated in FIG. 3B. In FIG. 3B, the display 24 includes the text "General Profile—30 mW", "Meeting Profile—32 mW", "Max Performance—45 mW", "Max Battery—15 mW".

The user may then operate the user input device 22 to select one of the configurations displayed on the display 24 to change the configuration of the apparatus 10. For example, if the user is aware that the electrical energy storage device 28 has a relatively low amount of electrical energy stored, he may select the "Max Battery" profile in order to increase the operating time of the apparatus 10.

Embodiments of the present invention provide an advantage in that they enable a user to see how the different configurations/profiles of the apparatus 10 affect the electrical energy consumption from the electrical energy storage device 28. This may enable a user to make an informed choice of configuration/profile for the apparatus 10 and increase the time period between re-charging the electrical energy storage device 28.

At block 50, the processor 14 determines values of one or more parameters of the electrical energy storage device 28 for one or more user programmable apparatus settings. The processor 14 may read from the database 44 stored in the memory 16 to determine values of the one or more parameters. For example, the processor 14 may read an average power consumption value from the database 44 for a display brightness setting.

The processor 14 then controls the display 24 to display the determined values of the one or more parameters of the electrical energy storage device 28 to a user of the apparatus 10. The processor 14 may control the display 24 to display the parameter values in response to a user request (for example, the user may select a user selectable object (an icon for example) of the graphical user interface to cause the display of the parameter values).

Figure 3C:
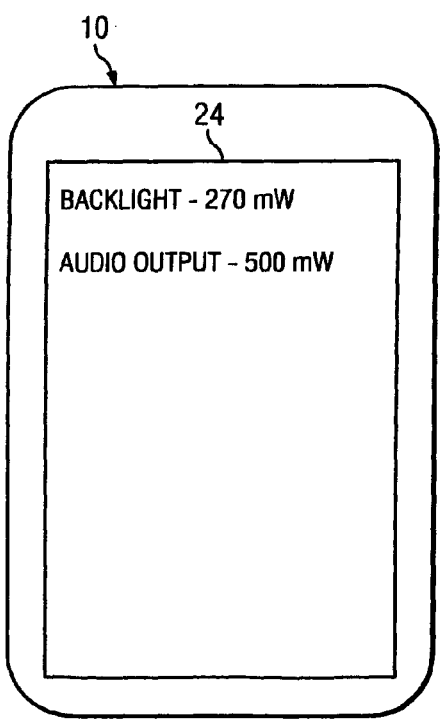

For example, the processor 14 may control the display 24 to display the average power consumption value for the backlight of the display and for the audio output device as illustrated in FIG. 3C. In FIG. 3C, the display 24 displays the text "Back Light—270 mW" and "Audio Output—500 mW".

Embodiments of the present invention provide an advantage in that they enable a user to see how the user programmable apparatus settings of the apparatus 10 affect the electrical energy consumption from the electrical energy storage device 28.

At block 52, the processor 14 determines values of one or more parameters of the electrical energy storage device 28 for one or more applications. The processor 14 may read from the database 44 stored in the memory 16 to determine values of the one or more parameters. For example, the processor 14 may read an average power consumption value from the database 44 for a web browser application.

The processor 14 then controls the display 24 to display the determined values of the one or more parameters of the electrical energy storage device 28 to a user of the apparatus 10. The processor 14 may control the display 24 to display the parameter values in response to a user request (for example, the user may select a user selectable object (an icon for example) of the graphical user interface to cause the display of the parameter values).

Figure 3D:
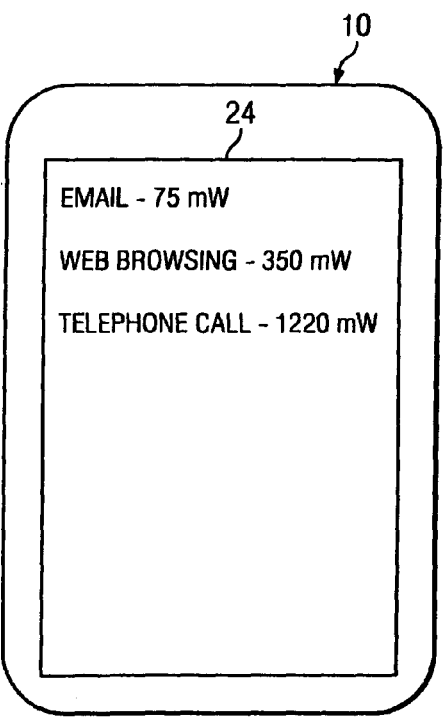

For example, the processor 14 may control the display 24 to display the average power consumption value for an e-mail application, a web browser application and a telephone application as illustrated in FIG. 3D. In FIG. 3D, the display 24 displays the text "E-mail—75 mW", "Web Browsing—350 mW" and "Telephone Call—1220 mW".

Embodiments of the present invention provide an advantage in that they enable a user to see how the various applications of the apparatus 10 affect the electrical energy consumption from the electrical energy storage device 28.

It should be appreciated that the processor 14 may be configured to control the display 24 to display the parameter values in other formats. For example, the parameter values may be displayed as bars, plots, graphs and so on. In addition, the parameter values may be shown as non-numerical text, such as "You have enough battery energy left for the scheduled telephone conference in the afternoon". In order to display such text, the processor 14 may access a user's schedule/diary stored in the memory 16, determine if the electrical energy device 28 includes sufficient electrical energy for the scheduled activities and then control the display 24 to display appropriate text. Furthermore, the database 44 may store parameters having various different units. For example, the parameter values may have units such as Watts, Ampere hours, percentages and the remaining operating time may have units such as days, hours and minutes.

Figure 4:
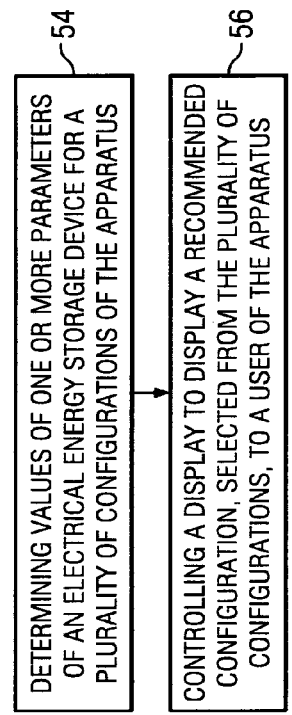
FIG. 4 illustrates a flow diagram of another method according to various embodiments of the invention.

FIG. 4 illustrates a flow diagram of another method according to various embodiments of the invention. At block 54, the processor 14 determines values of one or more parameters of the electrical energy storage device 28 for a plurality of configurations of the apparatus 10. The processor 14 may read from the database 44 stored in the memory 16 to determine values of the one or more parameters. For example, the processor 14 may read average power consumption values or remaining operating times from the database 44 for a plurality of configurations.

At block 56, the processor 14 controls the display 24 to display a recommended configuration to a user of the apparatus 10, using the determined parameter values. For example, the processor 14 may determine that the remaining operating time is below a predetermined threshold (twenty five percent of capacity for example) and may then control the display 24 to display a message recommending that the configuration of the apparatus 10 be changed to a configuration that has lower power consumption (the 'Max Battery' configuration for example). The user may control the user input device 22 to select the recommended configuration and change the operating configuration of the apparatus 10.

Figure 5:
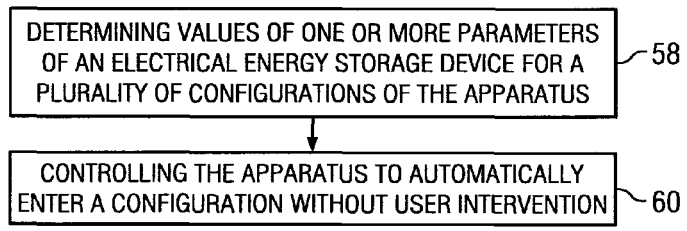
FIG. 5 illustrates a flow diagram of a further method according to various embodiments of the invention.

FIG. 5 illustrates a flow diagram of a further method according to various embodiments of the invention. At block 58, the processor 14 determines values of one or more parameters of the electrical energy storage device 28 for a plurality of configurations of the apparatus 10. The processor 14 may read from the database 44 stored in the memory 16 to determine values of the one or more parameters. For example, the processor 14 may read average power consumption values or remaining operating times from the database 44 for a plurality of configurations.

At block 60, the processor 14 uses the determined parameter values of the configurations to automatically change the configuration of the apparatus 10 without user intervention (that is, the user does not control the change in apparatus configuration). For example, the processor 14 may determine that the remaining operating time is below a predetermined threshold (twenty five percent of capacity for example), review the average power consumption values for the configurations, and may then automatically change the configuration of the apparatus 10 to a configuration that has lower average power consumption value (the 'Max Battery' configuration or the 'Meeting Profile' configuration for example).

Figure 6:
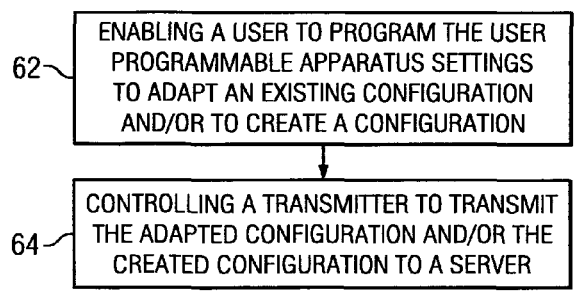
FIG. 6 illustrates a flow diagram of another method according to various embodiments of the invention.

FIG. 6 illustrates a flow diagram of another method according to various embodiments of the invention. The method illustrated in FIG. 6 flows from block 50 of the method illustrated in FIG. 2.

At block 62, the method includes enabling a user to program one or more of the user programmable apparatus settings to adapt an existing configuration and/or create a new configuration. For example, a user may review the average power consumption values for several user programmable apparatus settings in a particular configuration and notice that one of the settings (brightness of the display 24 for example) is set at a level that unnecessarily consumes a relatively large amount of electrical energy. The user may then lower the level of that setting (for example, reduce the brightness of the display 24) so that it consumes less electrical energy. The user may then save the adapted configuration over the previously saved configuration and/or save the configuration as a new configuration.

At block 64, the processor 14 controls the transceiver 18 and the antenna 20 to transmit the adapted configuration and/or the created configuration to the server 12. It should be appreciated that the such a configuration may be transmitted also using any other data transfer means supported by the apparatus 10, such as Universal Serial Bus (USB), infrared communications, or even physical transfer using a removable memory (for example, a Multi Media Card (MMC), Secure Digital card (SD)). Block 64 may be executed automatically by the processor 14 or may be executed upon request by a user of the apparatus 10.

The server 12 is configured to store the received configuration in the memory 36. Other apparatus (not illustrated in FIG. 1) may request and download the configuration stored in the memory 36 of the server 12.

Embodiments of the present invention provide an advantage in that the server may enable configurations to be shared between different apparatus. Since it may require a user to possess some technical knowledge/ability to adapt an existing configuration and/or create a new configuration, embodiments of the invention enable these configurations to be shared with user's who do not possess such technical knowledge/ability. As an incentive to encourage users to upload configurations to the server 12, competitions may be run for the most energy efficient configuration for a particular context (most energy efficient outdoor profile for example). Companies may also make configurations that are optimized for their employees or customers. For example, a shopping mall company may create a 'shopping mall' profile that assists customers to optimize their battery life while they are shopping in the shopping mall.

The blocks illustrated in the FIGS. 2, 4, 5 and 6 may represent steps in a method and/or sections of code in the computer program 30. The illustration of a particular order to the blocks does not necessarily imply that there is a required or preferred order for the blocks and the order and arrangement of the block may be varied. Furthermore, it may be possible for some steps to be omitted.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. An apparatus comprising:
at least one memory storing computer program instructions;
at least one processor configured to execute the computer program instructions to cause the apparatus at least to perform:
determining values of one or more parameters of an electrical energy storage device for a plurality of configurations of the apparatus, the plurality of configurations comprising a plurality of profiles being defined by one or more user programmable apparatus settings;
controlling a transmitter to transmit an adapted profile or a created profile to a server, the server being configured to transmit the adapted profile or the created profile to another apparatus;
performing a function using the determined values of the one or more parameters of the electrical energy storage device which enable a user to see the effect of each of one or more applications of the apparatus on the electrical energy consumption from the electrical energy storage device;
accessing a schedule of events for a user of the apparatus;
determining, based on the schedule of events for the user of the apparatus, if the electrical energy storage device has sufficient electrical energy to power the apparatus for at least one event on the schedule of events; and
providing for display of a notification comprising information about whether the energy storage device has sufficient electrical energy for the at least one event.

2. An apparatus as claimed in claim 1, wherein the function includes controlling a display to display the determined values of the one or more parameters of the electrical energy storage device to a user of the apparatus.

3. An apparatus as claimed in claim 1, wherein the function includes controlling the apparatus to automatically enter a profile without user intervention.

4. An apparatus as claimed in claim 1, wherein the at least one processor is configured to execute the computer program instructions to cause the apparatus to further perform: determining values for a parameter of an electrical energy storage device for one or more user programmable apparatus settings, and controlling a display to display the determined parameter values for the one or more user programmable apparatus settings.

5. An apparatus as claimed in claim 1, wherein one of the parameters is indicative of the usage of the electrical energy storage device by the apparatus.

6. An apparatus as claimed in claim 1, wherein one of the parameters includes power consumption of the electrical energy storage device by the apparatus.

7. An apparatus as claimed in claim 1, wherein one of the parameters includes remaining operating time of the apparatus being powered by the electrical energy storage device.

8. An apparatus as claimed in claim 1, wherein the user programmable apparatus settings are configured to control how one or more components of the apparatus function and are independent of any applications being executed by the at least one processor.

9. A method comprising:
determining values of one or more parameters of an electrical energy storage device for a plurality of configurations of an apparatus, the plurality of configurations comprising a plurality of profiles being defined by one or more user programmable apparatus settings;

controlling a transmitter to transmit an adapted profile or a created profile to a server, the server being configured to transmit the adapted profile or the created profile to another apparatus;

performing a function using the determined values of the one or more parameters of the electrical energy storage device;

determining a value of a parameter of the electrical energy storage device for one or more applications, controlling a display to display the determined parameter values of the one or more applications which display the effect of one or more applications of the apparatus on the consumption of electrical energy from the electrical energy storage device;

accessing a schedule of events for a user of the apparatus;

determining, based on the schedule of events for the user of the apparatus, if the electrical energy storage device has sufficient electrical energy to power the apparatus for at least one event on the schedule of events; and providing for display of a notification comprising information about whether the energy storage device has sufficient electrical energy for the at least one event.

10. A method as claimed in claim 9, wherein the function includes controlling a display to display a recommended profile, selected from the plurality of profiles, to a user of the apparatus.

11. A method as claimed in claim 9, wherein the plurality of configurations comprise a plurality of profiles and the plurality of profiles are defined by one or more user programmable apparatus settings.

12. A computer program product comprising at least one non-transitory computer-readable storage medium having computer-executable program code instructions stored therein that, when executed by a processor, performs:

determining values of one or more parameters of an electrical energy storage device for a plurality of configurations of an apparatus, the plurality of configurations comprising a plurality of profiles being defined by one or more user programmable apparatus settings;

controlling a transmitter to transmit an adapted profile or a created profile to a server, the server being configured to transmit the adapted profile or the created profile to another apparatus;

performing a function using the determined values of the one or more parameters of the electrical energy storage device;

determining a value of a parameter of the electrical energy storage device for one or more applications, controlling a display to display the determined parameter values of the one or more applications, wherein the displayed parameter values of the one or more applications show the effect of the one or more applications on the consumption of electrical energy from the electrical energy storage device;

accessing a schedule of events for a user of the apparatus;

determining, based on the schedule of events for the user of the apparatus, if the electrical energy storage device has sufficient electrical energy for at least one event on the schedule of events; and providing for display of a notification comprising information about whether the energy storage device has sufficient electrical energy for the at least one event.

13. A computer program product as claimed in claim 12, wherein the display is controlled to display of the effect on the electrical energy consumption from said electrical storage device of each of one or more applications of the apparatus.

14. An computer program product as claimed in claim 12, wherein the function includes controlling a display to display a recommended profile, selected from the plurality of profiles, to a user of the apparatus.

15. An computer program product as claimed in claim 12, wherein the at least one processor is configured to execute the computer program instructions to cause the apparatus to further perform: enabling a user to program the user programmable apparatus settings to adapt an existing profile and/or to create a profile.

* * * * *